(12) United States Patent
Lee et al.

(10) Patent No.: US 10,284,183 B2
(45) Date of Patent: May 7, 2019

(54) SLEW RATE ENHANCEMENT CIRCUIT AND BUFFER USING THE SAME

(71) Applicant: Aconic Inc., Gwangju (KR)

(72) Inventors: Minjae Lee, Gyeonggi-do (KR); Eunseok Song, Seoul (KR)

(73) Assignee: Aconic Inc., Gwangju (KR)

( * ) Notice: Subject to any disclaimer, the term of this patent is extended or adjusted under 35 U.S.C. 154(b) by 0 days.

(21) Appl. No.: 15/980,288

(22) Filed: May 15, 2018

(65) Prior Publication Data

US 2018/0337662 A1    Nov. 22, 2018

(30) Foreign Application Priority Data

May 18, 2017    (KR) .......................... 10-2017-0061363

(51) Int. Cl.
    *H03K 5/04*      (2006.01)
    *G09G 3/3225*    (2016.01)
    *G09G 3/36*      (2006.01)

(52) U.S. Cl.
    CPC ............ *H03K 5/04* (2013.01); *G09G 3/3225* (2013.01); *G09G 3/3648* (2013.01); *G09G 2310/066* (2013.01); *G09G 2320/0252* (2013.01); *G09G 2330/021* (2013.01)

(58) Field of Classification Search
    CPC .................................. H03K 5/12; H03K 5/04
    See application file for complete search history.

(56) References Cited

U.S. PATENT DOCUMENTS

| | | | | |
|---|---|---|---|---|
| 4,634,890 A * | 1/1987 | Lee | ......................... | G11C 7/12 326/21 |
| 4,791,324 A * | 12/1988 | Hodapp | ................. | G11C 7/062 327/53 |
| 5,488,320 A * | 1/1996 | Carvella | .............. | H03K 5/2481 327/203 |
| 7,298,182 B2 * | 11/2007 | Kim | ...................... | G11C 11/406 327/65 |
| 7,336,133 B2 * | 2/2008 | Shor | ....................... | G05F 3/262 330/288 |
| 7,362,173 B1 * | 4/2008 | Knausz | ................. | H03F 3/4521 330/253 |

(Continued)

FOREIGN PATENT DOCUMENTS

| | | |
|---|---|---|
| JP | 8-335860 | 12/1996 |
| KR | 100442226 | 7/2004 |

(Continued)

*Primary Examiner* — Thomas J. Hiltunen
(74) *Attorney, Agent, or Firm* — IP & T Group LLP

(57) ABSTRACT

The slew rate enhancement circuit includes: a first transistor located between a first power source and an eleventh node, the first transistor having a gate electrode coupled to the eleventh node, the first transistor being coupled as a current mirror to the first current source; a third current source having the other side coupled to a second power source lower than the first power source; a second transistor coupled between the first power source and the eleventh node; a third transistor coupled between the eleventh node and one side of the third current source; a fourth transistor coupled between the first power source and a twelfth node; and a fifth transistor coupled between the twelfth node and the one side of the third current source.

15 Claims, 6 Drawing Sheets

(56) References Cited

U.S. PATENT DOCUMENTS

| | | | | |
|---|---|---|---|---|
| 7,436,261 B2* | 10/2008 | Kazuyoshi | .......... | H03F 3/45183 330/252 |
| 7,737,781 B2* | 6/2010 | Kang | ................. | H03F 3/45183 330/124 R |
| 7,859,135 B2* | 12/2010 | Sako | ...................... | G11C 5/143 307/115 |
| 8,089,314 B2* | 1/2012 | Thakker | .............. | H03F 3/45475 330/253 |
| 8,648,637 B2* | 2/2014 | Kim | .................... | G09G 3/3685 327/170 |
| 9,209,790 B1* | 12/2015 | Wadhwa | .............. | H03K 5/2472 |
| 9,543,912 B2* | 1/2017 | Lee | ........................ | H03F 3/301 |

FOREIGN PATENT DOCUMENTS

| | | |
|---|---|---|
| KR | 100706576 | 4/2007 |
| KR | 100979384 | 8/2010 |
| KR | 1020130107121 | 10/2013 |
| KR | 1020160032772 | 3/2016 |
| KR | 1020170005291 | 1/2017 |

* cited by examiner

SLEW RATE ENHANCEMENT CIRCUIT AND BUFFER USING THE SAME

CROSS-REFERENCE TO RELATED APPLICATION

The present application claims priority under 35 U.S.C. § 119(a) to Korean patent application 10-2017-0061363 filed on May 18, 2017 in the Korean Intellectual Property Office, the entire disclosure of which is incorporated herein by reference.

BACKGROUND

1. Technical Field

The present disclosure generally relates to a slew rate enhancement circuit and a buffer using the same, and more particularly, to a slew rate enhancement circuit capable of minimizing power consumption and performing a high-speed operation, and a buffer using the slew rate enhancement circuit.

2. Related Art

With the development of information technologies, the importance of a display device which is a connection medium between a user and information increases. Accordingly, display devices such as a liquid crystal display device and an organic light emitting display device are increasingly used.

In general, a display device includes a data driver for supplying a data signal to data lines, a scan driver for supplying a scan signal to scan lines, and pixels coupled to the scan lines and the data lines.

The data driver generates a data signal, using data supplied from the outside, and supplies the generated data signal to a pixel through a data line. The data driver includes buffers respectively coupled to the data lines.

Meanwhile, with development of technologies, frame frequencies and resolutions of display devices are increasing. When the frame frequency and resolution of a display device increase, the time required to drive lines is decreased, and therefore, a high-speed operation of buffers is required. Accordingly, there is required a buffer capable of minimizing power consumption and performing a high-speed operation.

SUMMARY

According to an aspect of the present disclosure, there is provided a slew rate enhancement circuit for controlling current flow of a first current source, the slew rate enhancement circuit including: a first transistor located between a first power source and an eleventh node, the first transistor having a gate electrode coupled to the eleventh node, the first transistor being coupled as a current mirror to the first current source; a third current source having the other side coupled to a second power source lower than the first power source; a second transistor coupled between the first power source and the eleventh node; a third transistor coupled between the eleventh node and one side of the third current source, the third transistor having a gate electrode supplied with a first control voltage; a fourth transistor coupled between the first power source and a twelfth node, the fourth transistor having a gate electrode coupled to a gate electrode of the second transistor and the twelfth node; and a fifth transistor coupled between the twelfth node and the one side of the third current source, the fifth transistor having a gate electrode supplied with a second control voltage.

The slew rate enhancement circuit may further include a sixth transistor coupled between the first transistor and the eleventh node, the sixth transistor being set to a turn-on state by a first bias voltage.

The first transistor, the second transistor, the fourth transistor, and the sixth transistor may be set as P-type transistors, and the third transistor and the fifth transistor may be set as N-type transistors.

When the W/L of the fourth transistor is set to "1," the W/L of the second transistor may be set to "N" (N is a rational number exceeding 1).

When the W/L of the third transistor is set to "1," the W/L of the fifth transistor may be set to "N" (N is a rational number exceeding 1).

No current may flow in the first current source when the first control voltage and the second control voltage are equal to each other, and a current may flow in the first current source when the first control voltage is set higher than the second control voltage.

The slew rate enhancement circuit may further include: a first switch coupled between the first power source and the twelfth node; and a second switch located between the one side of the third current source and a common node of the third transistor ad the fifth transistor.

According to another aspect of the present disclosure, there is provided a slew rate enhancement circuit for controlling current flow of a second current source, the slew rate enhancement circuit including: an eleventh transistor located between a twenty-first node and a second power source, the eleventh transistor having a gate electrode coupled to the twenty-first node, the eleventh transistor being coupled as a current mirror to the second current source; a fourth current source having the other side coupled to a first power source higher than the second power source; a twelfth transistor coupled between the twenty-first node and the second power source; a thirteenth transistor coupled between one side of the fourth current source and the twenty-first node, the thirteenth transistor having a gate electrode supplied with a third control voltage; a fourteenth transistor coupled between a twenty-second node and the second power source, the fourteenth transistor having a gate electrode coupled to a gate electrode of the twelfth transistor and the twenty-second node; and a fifteenth transistor coupled between the one side of the fourth current source and the twenty-second node, the fifteenth transistor having a gate electrode supplied with a fourth control voltage.

The slew rate enhancement circuit may further include a sixteenth transistor coupled between the eleventh transistor and the twenty-first node, the sixteenth transistor being set to a turn-on state by a second bias voltage.

The eleventh transistor, the twelfth transistor, fourteenth transistor, and the sixteenth transistor may be set as N-type transistors, and the thirteenth transistor and the fifteenth transistor may be set as P-type transistors.

When the W/L of the fourteenth transistor is set to "1," the W/L of the twelfth transistor may be set to "N" (N is a rational number exceeding 1).

When the W/L of the thirteenth transistor is set to "1," the W/L of the fifteenth transistor may be set to "N" (N is a rational number exceeding 1).

No current may flow in the second current source when the third control voltage and the fourth control voltage are equal to each other, and a current may flow in the second current source when the third control voltage is set lower than the fourth control voltage.

The slew rate enhancement circuit may further include: a third switch coupled between the second power source and the twenty-second node; and a fourth switch located between the one side of the fourth current source and a common node of the thirteenth transistor and the fifteenth transistor.

According to another aspect of the present disclosure, there is provided a buffer including: a first capacitor coupled between a first node and an output terminal; a second capacitor coupled between a second node and the output terminal; a first current source coupled between a first power source and the first node, the first current source supplying a current to the first node; a second current source coupled between the second node and a second power source set as a voltage lower than that of the first power source, the second current source sinking a current from the second node; a driver configured to supply a data signal to the output terminal; a first slew rate enhancement circuit configured to control current flow of the first power source; and a second slew rate enhancement circuit configured to control current flow of the second current source, wherein, when the output terminal maintains a constant voltage, the first slew rate enhancement circuit controls no current to flow in the first current source, and the second slew rate enhancement circuit controls no current to flow in the second current source.

The first slew rate enhancement circuit may be the above-described slew rate enhancement circuit.

The second slew rate enhancement circuit may be the above-described slew rate enhancement circuit.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
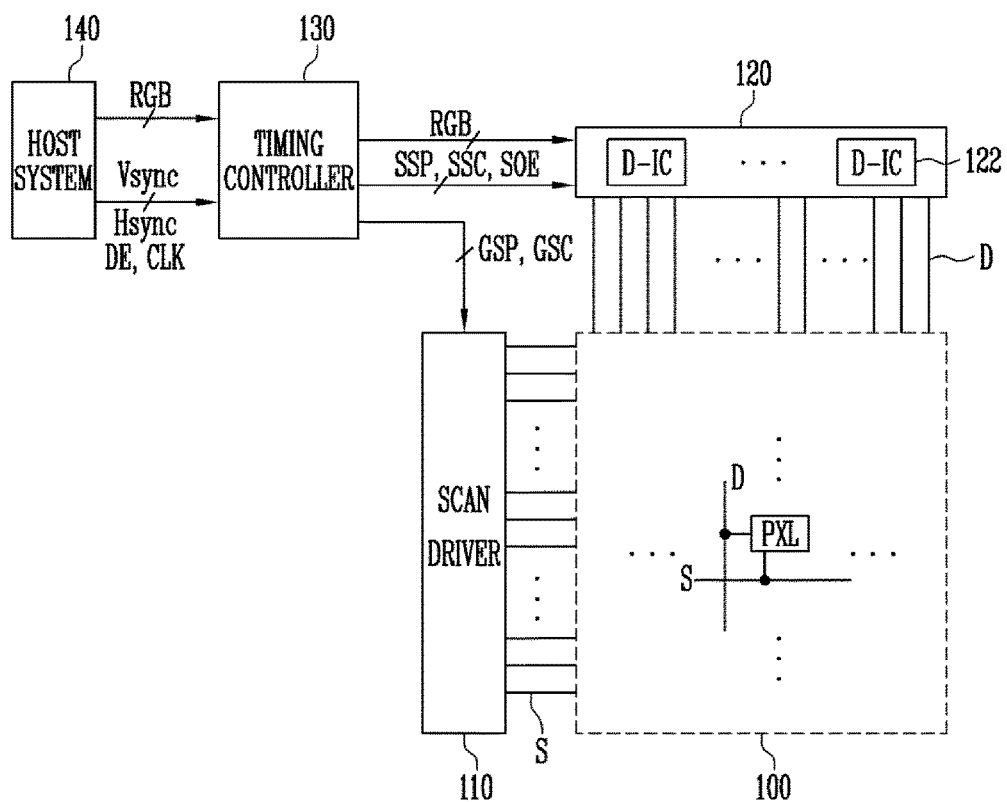
FIG. 1 is a diagram schematically illustrating a display device according to an embodiment of the present disclosure.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. Further, some of the elements that are not essential to the complete understanding of the disclosure are omitted for clarity. Also, like reference numerals refer to like elements throughout.

FIG. 1 is a diagram schematically illustrating a display device according to an embodiment of the present disclosure.

Referring to FIG. 1, the display device according to the embodiment of the present disclosure includes a pixel unit 100, a scan driver 110, a data driver 120, a timing controller 130, and a host system 140.

The pixel unit 100 includes a plurality of pixels PXL each coupled to a data line D and a scan line S. Each of the pixels PXL supplies light with a predetermined luminance according to a data signal.

When the display device is set as an organ light emitting display device, each of the pixels PXL includes a plurality of transistors (not shown) including a driving transistor (not shown), and an organic light emitting diode (not shown). The pixel PXL is selected when a scan signal is supplied to a scan line S to receive a data signal from a data line D. Subsequently, the driving transistor included in the pixel PXL supplies a current corresponding to the data signal to the organic light emitting diode, and accordingly, light with a predetermined luminance is generated in the organic light emitting diode.

When the display device is set as a liquid crystal display device, each of the pixels PXL includes a switching transistor (not shown) and a liquid crystal capacitor (not shown). The pixel PXL is selected when a scan signal is supplied to a scan line S to receive a data signal from a data line D. Subsequently, the pixel PXL controls the transmittance of liquid crystals, corresponding to the data signal, so that light with a predetermined luminance is supplied to the outside.

Additionally, FIG. 1 illustrates that the pixel PXL is coupled to one data line D and one scan line S, but the present disclosure is not limited thereto. As an example, various signal lines may be additionally coupled to the pixel PXL, corresponding to the pixel structure of the pixel PXL. That is, in the embodiment of the present disclosure, the pixel PXL may be implemented with various types of pixels currently known in the art.

The scan driver 110 supplies scan signals to scan lines S. When the scan signals are sequentially supplied to the scan lines S, the pixels PXL are selected in units of horizontal lines. The scan driver 110 may be mounted on a panel. That is, the scan driver 110 may be mounted on a substrate through a thin film process. Also, the scan driver 110 may be mounted at both sides of the pixel unit 100. The scan signal functions to transfer a data signal supplied through a data line D to pixels PXL.

The data driver 120 generates data signals, using data RGB input from the timing controller 130. To this end, the data driver 120 includes at least one data integrated circuit (D-IC) 122. The data integrated circuit 122 is coupled to data lines D, and supplies data signals to the data lines D coupled thereto. The data signals generated by the data integrated circuit 122 are supplied to the data lines D via buffers (not shown) located in channels, respectively.

The timing controller 130 supplies a gate control signal to the scan driver 110 and supplies a data control signal to the data driver 120, in response to timing signals such as data RGB, a vertical synchronization signal Vsync, a horizontal synchronization signal Hsync, a data enable signal DE, and a clock signal CLK, which are output from the host system 140.

The gate control signal includes a gate start pulse GSP and at least one gate shift clock GSC. The gate start pulse GSP controls a timing of a first scan signal. The gate shift clock GSC refers to at least one clock signal for shifting the gate start pulse GSP.

The data control signal includes a source start pulse SSP, a source sampling clock SSC, a source output enable SOE, and the like. The source start pulse SSP controls a data sampling start time of the data driver 120. The source sampling clock SSC controls a sampling operation of the data driver 120, based on a rising or falling edge. The source output enable SOE controls an output timing of the data driver 120.

The host system 140 supplies the data RGB to the timing controller 120 through a predetermined interface. Also, the host system 140 supplies the timing signals Vsync, Hsync, DE, and CLK to the timing controller 130.

Figure 2:
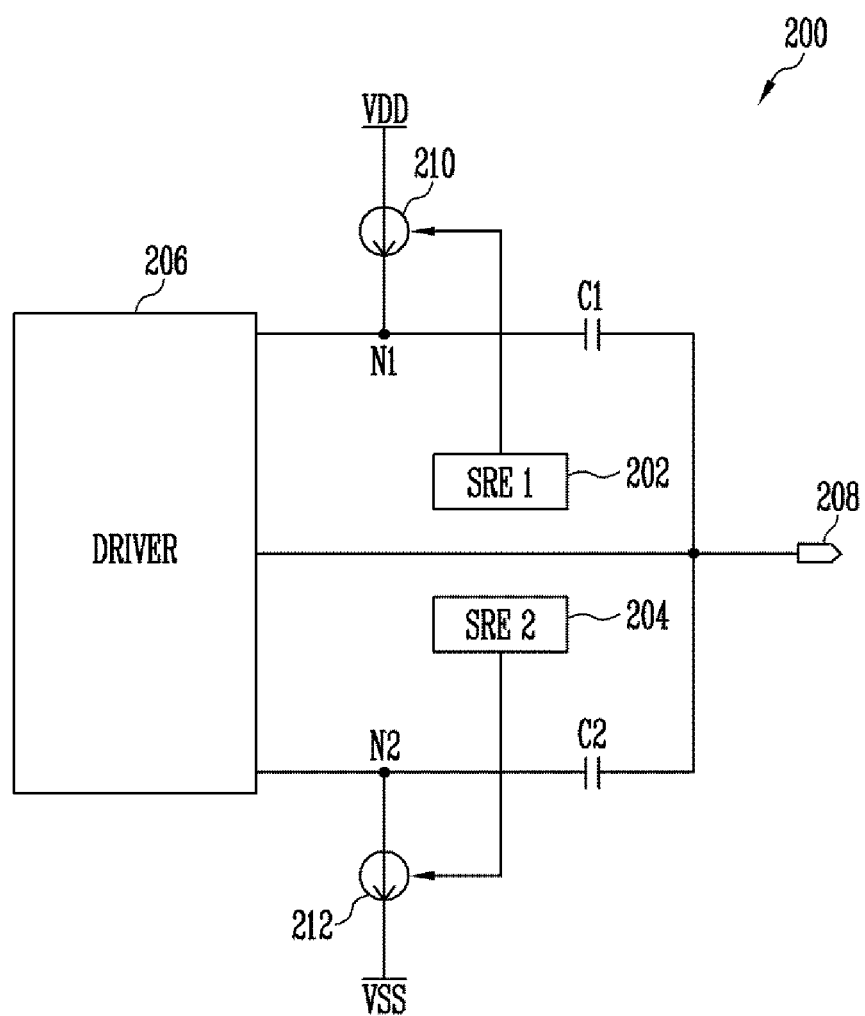
FIG. 2 is a diagram illustrating an embodiment of a buffer included in a data integrated circuit of FIG. 1.

FIG. 2 is a diagram illustrating an embodiment of the buffer included in the data integrated circuit of FIG. 1.

Referring to FIG. 2, the buffer 200 according to the embodiment of the present disclosure includes a driver 206, a first slew rate enhancement circuit (SRE1) 202, a second slew rate enhancement circuit (SRE2) 204, a first capacitor C1, and a second capacitor C2.

The driver 206 supplies a data signal to an output terminal 208. The driver 206 refers to a general circuit of the buffer, and may be implemented with various types of circuits currently known in the art. As an example, the driver 206 may be implemented as disclosed in U.S. Pat. No. 7,362,173. Additionally, the output terminal 208 may be electrically coupled to any one of the data lines included in the display device.

A first current source 210 is coupled between a first power source VDD and a first node N1. The first current source 210 is selectively driven under the control of the first slew rate enhancement circuit 202. When the first current source 201 is driven, a predetermined current is supplied to the first node N1.

A second current source 212 is coupled to a second node N2 and a second power source VSS. The second power source VSS may be set to a voltage lower than that of the first power source VDD. The second current source 212 is selectively driven under the control of the second slew rate enhancement circuit 204. When the second current source 212 is driven, a predetermined current is supplied from the second node N2.

The first current source 210 and the second current source 212 are for the purpose of improving the charging/discharging speeds of the first node N1 and the second node N2, and are used to minimize a slew rate section.

The first capacitor C1 is coupled between the first node N1 and the output terminal 208. The second capacitor C2 is coupled between the second node N2 and the output terminal 208. The first capacitor C1 and the second capacitor C2 are used as frequency compensation capacitors for preventing oscillation of the buffer 200. When the first capacitor C1 and the second capacitor C2 are included in the buffer 200, there exists a slew rate section in which the buffer 200 nonlinearly operates.

When the slew rate section is lengthened, the stabilization time of the buffer 200 is increased, and therefore, the operating speed of the buffer 200 is lowered. In order to reduce the slew rate section, capacitances of the capacitors C1 and C2 are to be decreased, or currents of the current sources 210 and 212 are to be increased.

However, when the capacitances of the capacitors C1 and C2 are decreased, a phase margin of the buffer 200 decreases, and therefore, frequency characteristics of the buffer 200 are deteriorated. In addition, when the currents of the current sources 210 and 212 are increased, the power consumption of a plurality of buffers 200 included in the data driver 120 is increased. Thus, in the embodiment of the present disclosure, the power consumption of the buffer 200 are minimized while constantly maintaining the capacitances of the capacitors C1 and C2, using the slew rate enhancement circuits 202 and 204.

The first slew rate enhancement circuit 202 controls an operation of the first current source 210. As an example, the first slew rate enhancement circuit 202 controls no current to flow in the first current source 210 when the voltage of the output terminal 208 maintains a constant state. Also, the first slew rate enhancement circuit 202 controls the current to flow in the first current source 210 when the voltage of the output terminal 208 is changed (e.g., falling), and accordingly, the slew rate section can be minimized.

The second slew rate enhancement circuit 204 controls an operation of the second current source 212. As an example, the second slew rate enhancement circuit 204 controls no current to flow in the second current source 212 when the voltage of the output terminal 208 maintains a constant state. Also, the second slew rate enhancement circuit 204 controls the current to flow in the second current source 212 when the voltage of the output terminal 208 is changed (e.g., rising), and accordingly, the slew rate section can be minimized.

Figure 3:
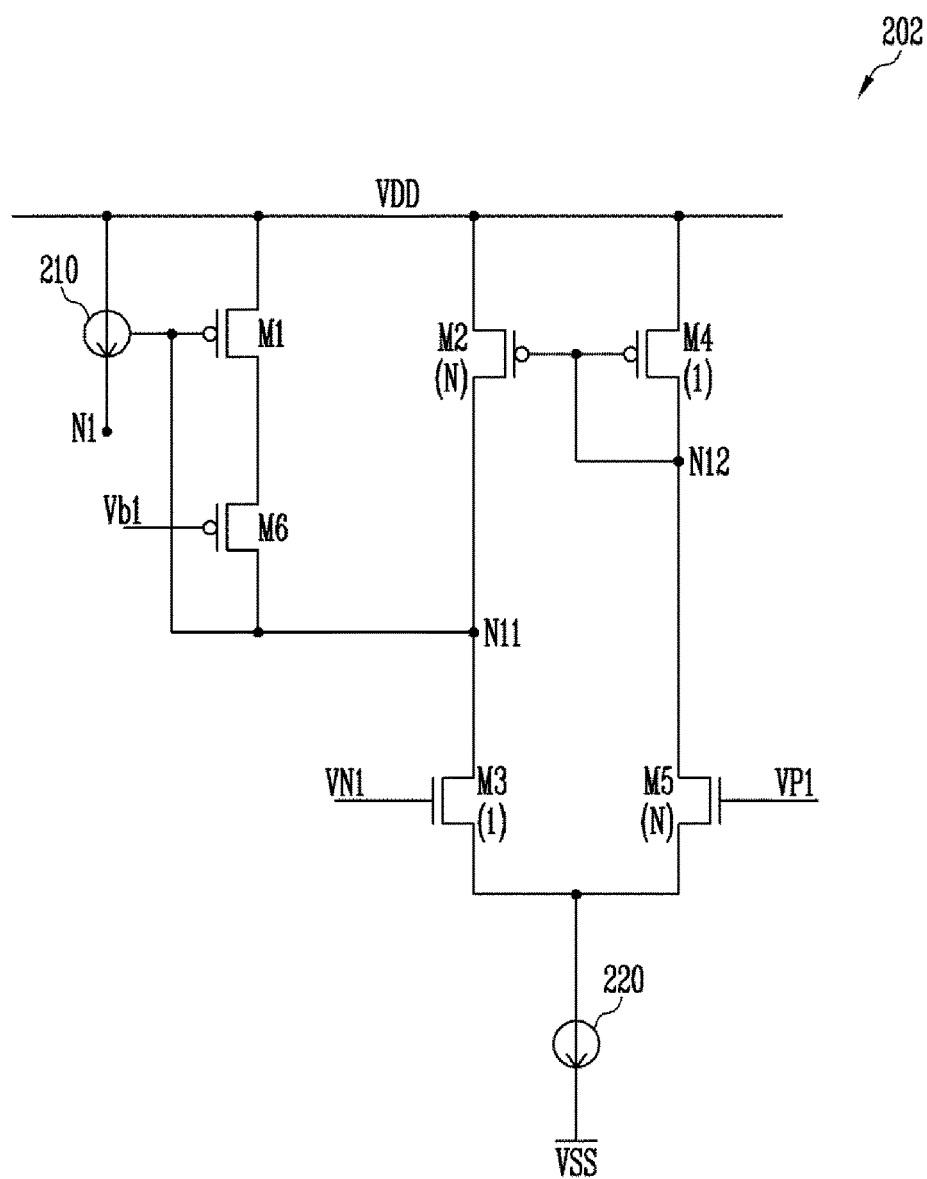
FIG. 3 is a diagram illustrating an embodiment of a first slew rate enhancement circuit shown in FIG. 2.

FIG. 3 is a diagram illustrating an embodiment of the first slew rate enhancement circuit shown in FIG. 2.

Referring to FIG. 3, the first slew rate enhancement circuit 202 includes first to sixth transistors M1 to M6 and a third current source 220.

The first transistor M1 coupled between the first power source VDD and an eleventh node N11. In addition, a gate electrode of the first transistor M1 is coupled between the first current source 210 and the eleventh node N11. That is, the first transistor M1 is diode-coupled such that a current flows from the first power source VOD to the eleventh node N11. The first transistor M11 supplies a predetermined current to the eleventh node N11 while being turned on or turned off corresponding to a voltage of the eleventh node N11.

The first current source 210 is coupled as a current mirror to the first transistor M1. To this end, the first current source 210 may be implemented with a transistor. When the current flows through the first transistor M1, the first current source 210 supplies a predetermined current to the first node N1. Otherwise, the first current source 210 does not supply the current to the first node N1.

The second transistor M2 is coupled between the first power source VDD and the eleventh node N11. In addition, a gate electrode of the second transistor M2 is electrically coupled to a gate electrode of the fourth transistor M4.

The third transistor M3 is coupled between the eleventh node N11 and the third current source 220 (e.g., one side of the third current 220). In addition, a gate electrode of the third transistor M3 is supplied with a first control voltage VN1. The third transistor M3 is driven corresponding to the first control voltage VN1.

The fourth transistor M4 is coupled between the first power source VDD and a twelfth node N12. In addition, the gate electrode of the fourth transistor M4 is coupled to the gate electrode of the second transistor M2 and the twelfth node N12. That is, the fourth transistor M4 is diode-coupled such that a current flows from the first power source VDD to the twelfth node N12. Also, the fourth transistor M4 is coupled as a current mirror to the second transistor M2.

Additionally, the second transistor M2 and the fourth transistor M4 are set to have different W/Ls. As an example, when the W/L of the fourth transistor M4 is set to "1," the W/L of the second transistor M2 may be set to "N" (N is a rational number exceeding 1). That is, the second transistor M2 may be set to have a W/L larger than that of the fourth transistor M4. To this end, the second transistor M2 may be configured such that a plurality of transistors are coupled in parallel (e.g., the N may be set to "2").

The fifth transistor M5 is coupled between the twelfth node N12 and the third current source 220 (e.g., the one side of the third current source 220). In addition, a gate electrode of the fifth transistor M5 is supplied with a second control voltage VP1. The fifth transistor M5 is driven corresponding to the second control voltage VP1.

Additionally, the third transistor M3 and the fifth transistor M5 are set to have different W/Ls. As an example, when the W/L of the third transistor M3 is set to "1," the W/L of the fifth transistor M5 may be set to "N." That is, the fifth transistor M5 may be set to have a W/L larger than that of the third transistor M3. To this end, the fifth transistor M5 may be configured such that a plurality of transistors are coupled in parallel.

The sixth transistor M6 is coupled between the first transistor M1 and the eleventh node N11. In addition, a gate electrode of the sixth transistor M6 is supplied with a first bias voltage Vb1. The sixth transistor M6 maintains a turn-on state, corresponding to the first bias voltage Vb1, and accordingly, the first transistor M1 and the eleventh node N11 are electrically coupled to each other.

When the sixth transistor M6 is located between the first transistor M1 and the eleventh node N11, a high impedance and a high gain can be secured, and accordingly, the operational reliability of the first slew rate enhancement circuit 202 can be improved.

Meanwhile, the first transistor M1, the second transistor M2, the fourth transistor M4, and the sixth transistor M6 are implemented with P-type transistors (e.g., PMOS transistors), and the third transistor M3 and the fifth transistor M5 are implemented with N-type transistors (e.g., NMOS transistors).

The one side of the third current source 220 is couple to a common node of the third transistor M3 and the fifth transistor M5, and the other side of the third current source 220 is coupled to the second power source VSS. The third current source 220 may be used as a current sink source for sinking a predetermined current. To this end, the third current source 220 may be implemented with a transistor that maintains the turn-on state, corresponding to a bias voltage.

When the first control voltage VN1 and the second control voltage VP1 are equal to each other, the operation process of the first slew rate enhancement circuit 202 is as follows.

When the first control voltage VN1 and the second control voltage VP1 are equal to each other, most of the current sunk from the third current source 220 flows through the fifth transistor M5 having a high W/L. That is, when the first control voltage VN1 and the second control voltage VP1 are equal to each other, a predetermined current flows through the fourth transistor M4 and the fifth transistor M5.

Meanwhile, when a current flows from the fourth transistor M4, a predetermined current also flows through the second transistor M2 coupled as the current mirror. Since the second transistor M2 is set to have a W/L higher than that of the fourth transistor M4, a large amount of current is instantaneously supplied to the eleventh node N11.

Meanwhile, a current minutely flows through the third transistor M3 having a relatively small WL, and accordingly, the voltage of the eleventh node N11 is increased to the voltage of the first power source VDD. When the eleventh node N11 is set to the voltage of the first power source VDD, the first transistor M1 is set to a turn-off state. When the first transistor M1 is set to the turn-off state, no current flows in the first current source 210.

That is, the first slew rate enhancement circuit 202 according to the embodiment of the present disclosure can control no current to flow in the first current source 210 by setting the first control voltage VN1 and the second control voltage VP1 to be equal to each other.

When the first control voltage VN1 is set as a voltage higher than the second control voltage VP1, the operation process of the first slew rate enhancement circuit 202 is as follows. The second control voltage VP1 may be set such that the fifth transistor M5 is turned off.

When the first control voltage VN1 is supplied, the third transistor M3 is turned on. When the third transistor M3 is turned on, the voltage of the eleventh node N11 is decreased to approximately the voltage of the second power source VSS. Then, a predetermined current is supplied to the second power source VSS through the first transistor M1, the sixth transistor M6, the third transistor M3, and the third current source 220 from the first power source VDD. Then, a predetermined current also flows in the first current source 210 coupled as the current mirror to the first transistor M1. The current flowing in the first current source 210 is supplied to the first node N1.

That is, in the embodiment of the present disclosure, the first slew rate enhancement circuit 202 can control a predetermined current to flow in the first current source 210 by setting the first control voltage VN1 to be higher than the second control voltage VP1. When the predetermined current flows from the first current source 210 to the first node N1, the slew rate section can be minimized.

As described above, the first slew rate enhancement circuit 202 according to the embodiment of the present disclosure can control a current to flow in the first current source 210 by setting the first control voltage VN1 to be higher than the second control voltage VP1. Further, the first slew rate enhancement circuit 202 according to the embodiment of the present disclosure can control no current to flow in the first current source 210 by setting the first control voltage VN1 and the second control voltage VP1 to be equal to each other.

That is, in the embodiment of the present disclosure, the first slew rate enhancement circuit 202 can control a current to flow in the first current source 210, if necessary. Accordingly, the power consumption of the buffer can be reduced, and the slew rate section can be minimized. In other words, although the amount of current flowing in the first current source 210 is increased, unnecessary current does not flow in the first current source 210. Hence, the power consumption of the buffer can be reduced, and the slew rate section can be minimized.

Figure 4:
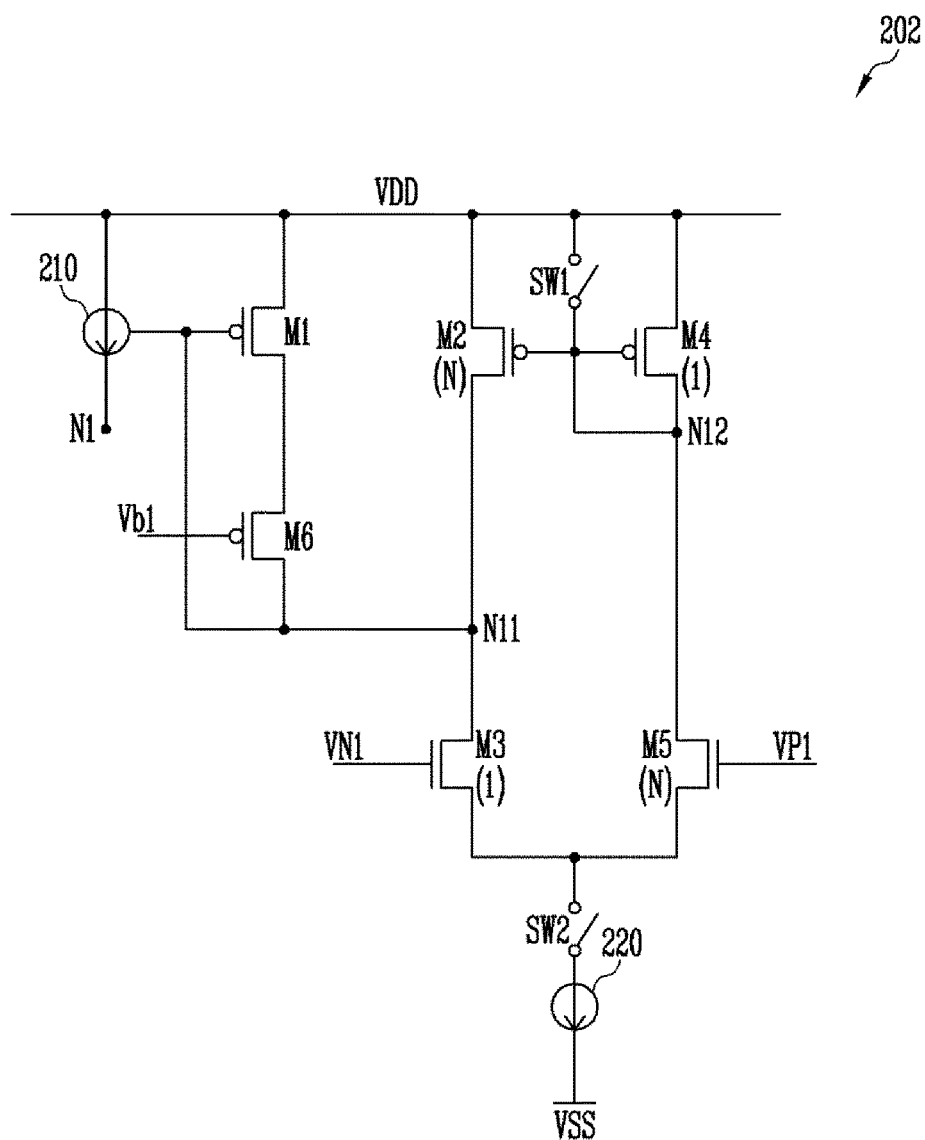
FIG. 4 is a diagram illustrating another embodiment of the first slew rate enhancement circuit shown in FIG. 2.

FIG. 4 is a diagram illustrating another embodiment of the first slew rate enhancement circuit shown in FIG. 2. In FIG.

4, components identical to those of FIG. 3 are designated by like reference numerals, and their detailed descriptions will be omitted.

Referring to FIG. 4, the first slew rate enhancement circuit 202 according to the another embodiment of the present disclosure additionally includes a first switch SW1 and a second switch SW2.

The first switch SW1 is coupled between the first power source VDD and the twelfth node N12. The first switch SW1 maintains the turn-off state when the first slew rate enhancement circuit 202 is normally driven.

The second switch SW2 is coupled between the third current source 220 and the common node of the third transistor M3 and the fifth transistor M5. The second switch SW2 maintains the turn-on state when the first slew rate enhancement circuit 202 is normally driven.

The first switch SW1 and the second switch SW2 are used to minimize the power consumption of the buffer. As an example, when the first switch SW1 is turned on, the voltage of the first power source VDD is supplied to the gate electrodes of the second transistor M2 and the fourth transistor M4, and accordingly, the second transistor M2 and the fourth transistor M4 are turned off.

In addition, when the second switch SW2 is turned off, the third current source 220 is electrically interrupted from the third transistor M3 and the fifth transistor M5. Then, no current flows from the third current source 220 to the third transistor M3 and the fifth transistor M5. As described above, the turn-on/turn-off of the first switch SW1 and the second switch SW2 can be controlled such that the power consumption of the buffer is reduced, corresponding to a user's design intension.

The first switch SW1 and/or the second switch SW2 may be implemented with a P-type transistor and/or an N-type transistor.

Figure 5:
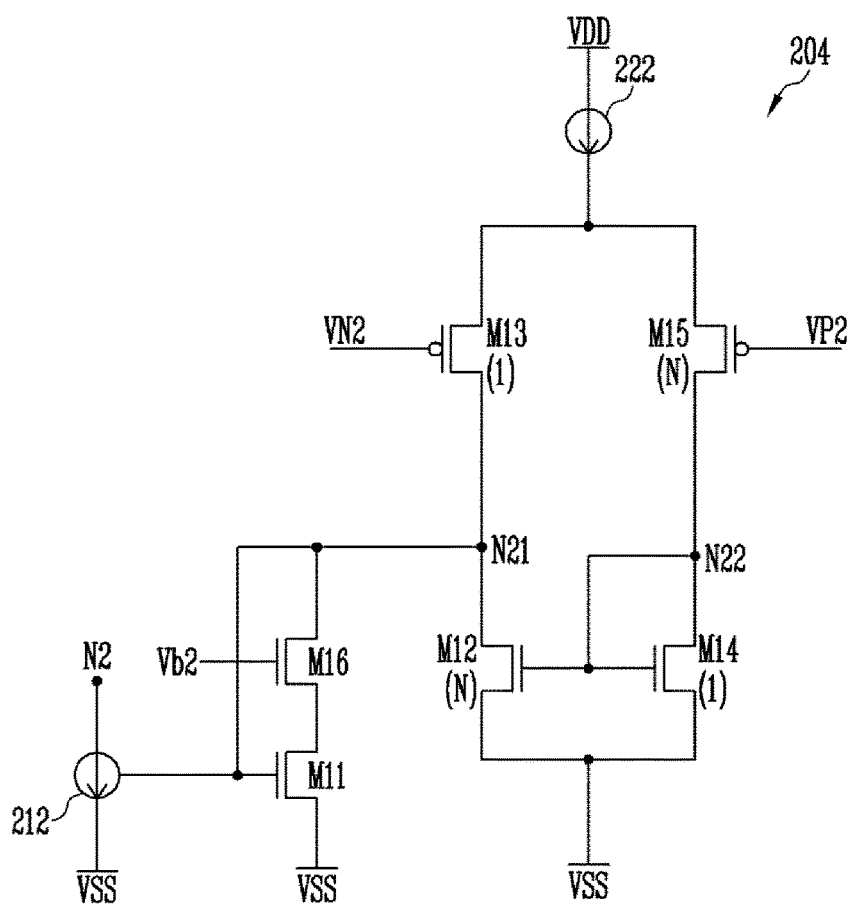
FIG. 5 is a diagram illustrating an embodiment of a second slew rate enhancement circuit shown in FIG. 2.

FIG. 5 is a diagram illustrating an embodiment of the second slew rate enhancement circuit shown in FIG. 2.

Referring to FIG. 5, the second slew rate enhancement circuit 204 includes eleventh to sixteenth transistors M11 to M16 and a fourth current source 222.

The eleventh transistor M11 is coupled between a twenty-first node N21 and the second power source VSS. In addition, a gate electrode of the eleventh transistor M11 is coupled to the second current source 212 and the twenty-first node N21. That is, the eleventh transistor M11 is diode-coupled such that a current can flow from the twenty-first node N21 to the second power source VSS. The eleventh transistor M11 is turned on or turned off corresponding to a voltage of the twenty-first node N21.

The second current source 212 is coupled as a current mirror to the eleventh transistor M11. To this end, the second current source 212 may be implemented with a transistor. When a current flows through the eleventh transistor M11, the second current source 212 sinks a predetermined current from the second node N2.

Otherwise, the second current source 212 sinks no current from the second node N2.

The twelfth transistor M12 is coupled between the twenty-first node N21 and the second power source VSS. In addition, a gate electrode of the twelfth transistor M12 electrically coupled to a gate electrode of the fourteenth transistor M14.

The thirteenth transistor M13 is coupled between a fourth current 222 (e.g., one side of the fourth current source 222) and the twenty-first node. In addition, a gate electrode of the thirteenth transistor M13 is supplied with a third control voltage VN2. The thirteenth transistor M13 is driven corresponding to the third control voltage VN2.

The fourteenth transistor M14 is coupled between a twenty-second node N22 and the second power source VSS. In addition, the gate electrode of the fourteenth transistor M14 is coupled between the gate electrode of the twelfth transistor M12 and the twenty-second node N22. That is, the fourteenth transistor M14 is diode-coupled such that a current can flow from the twenty-second node N22 to the second power source VSS. Also, the fourteenth transistor M14 is coupled as a current mirror to the twelfth transistor M12.

Additionally, the twelfth transistor M12 and the fourteenth transistor M14 are set to have different W/Ls. As an example, when the W/L of the fourteenth transistor M14 is set to "1," the W/L of the twelfth transistor M12 may be set to "N." That is, the twelfth transistor M12 may be set to have a W/L larger than that of the fourteenth transistor M14. To this end, the twelfth transistor M12 may be configured such that a plurality of transistors are coupled in parallel.

The fifteenth transistor M15 is coupled between the fourth current source 222 (e.g., the one side of the fourth current source 222) and the twenty-second node N22. In addition, a gate electrode of the fifteenth transistor M15 is supplied with a fourth control voltage VP2. The fifteenth transistor M15 is turned on or turned off corresponding to the fourth control voltage VP2.

Additionally, the thirteenth transistor M13 and the fifteenth transistor M15 are set to have different W/Ls. As an example, when the W/L of the thirteenth transistor M13 is set to "1," the W/L of the fifteenth transistor M15 may be set to "N." That is, the fifteenth transistor M15 may be set to have a W/L larger than that of the thirteenth transistor M13. To this end, the fifteenth transistor M15 may be configured such that a plurality of transistors are coupled in parallel.

The sixteenth transistor M16 is coupled between the twenty-first node N21 and the eleventh transistor M11. In addition, a gate electrode of the sixteenth transistor M16 is supplied with a second bias voltage Vb2. The sixteenth transistor M16 maintains the turn-on state, corresponding to the second bias voltage Vb2, and accordingly, the eleventh transistor M11 and the twenty-first node N21 are electrically coupled to each other.

When the sixteenth transistor M16 is located between the eleventh transistor M11 and the twenty-first node N21, a high impedance and a high gain can be secured, and accordingly, the operational reliability of the second slew rate enhancement circuit 204 can be improved.

Meanwhile, the eleventh transistor M11, the twelfth transistor M12, the fourteenth transistor M14, and the sixteenth transistor M16 are implemented with N-type transistors (e.g., NMOS transistors), and the thirteenth transistor M13 and the fifteenth transistor M15 are implemented with P-type transistors (e.g., PMOS transistors).

The one side of the fourth current source 222 is coupled to a common node of the thirteenth transistor M13 and the fifteenth transistor M15, and the other side of the fourth current source 222 is coupled to the first power source VDD. The fourth current source 222 may be used as a current source for supplying a predetermined current. To this end, the fourth current source 222 may be implemented with a transistor that maintains the turn-on state, corresponding to a bias voltage.

When the third control voltage VN2 and the fourth control voltage VP2 are equal to each other, the operation process of the second slew rate enhancement circuit 204 is as follows.

When the third control voltage VN2 and the fourth control voltage VP2 are equal to each other, most of the current supplied from the fourth current source 222 flows through the fifteenth transistor M15 having a high W/L. That is, when the third control voltage VN2 and the fourth control voltage VP2 are equal to each other, most of the current supplied from the fourth current source 222 flows into the second power VSS through the fifteenth transistor M15 and the fourteenth transistor M14.

Meanwhile, when a current flows from the fourteenth transistor M14, a predetermined current also flows through the twelfth transistor M12 coupled as the current mirror. Since the twelfth transistor M12 is set to have a W/L higher than that of the fourteenth transistor M14, the voltage of the twenty-first node N21 is decreased to approximately the voltage of the second power source VSS.

When the voltage of the twenty-first node N21 is decreased to the voltage of the second power source VSS, the eleventh transistor M11 is turned off. When the eleventh transistor M11 is turned off, no current flows in the second current source 212.

That is, the second slew rate enhancement circuit 204 according to the embodiment of the present disclosure can control no current flow in the second current source 212 by setting the third control voltage VN2 and the fourth control voltage VP2 to be equal to each other.

When the fourth control voltage VP2 is set as a voltage higher than the third control voltage VN2, the operation process of the second slew rate enhancement circuit 204 is as follows. The fourth control voltage VP2 may be set such that the fifteenth transistor M15 is turned off.

When the third control voltage VN2 is supplied, the thirteenth transistor M13 is turned on. When the thirteenth transistor M13 is turned on, a current from the fourth current source 222 is supplied to the second power source VSS through the thirteenth transistor M13, the sixteenth transistor M16, and the eleventh transistor M11. Then, a predetermined current also flows in the second current source 212 coupled as the current mirror, and accordingly, a predetermined current is sunk from the second node to the second power source VSS.

That is, in the embodiment of the present disclosure, the second slew rate enhancement circuit 204 can control a predetermined current flow in the second current source 212 by setting the third control voltage VN2 to be lower than the fourth control voltage VP2. When the current flows in the second current source 212, the slew rate section can be minimized.

As described above, the second slew rate enhancement circuit 204 according to the embodiment of the present disclosure can control a current to flow in the second current source 212 by setting the third control voltage VN2 to be lower than the fourth control voltage VP2. Further, the second slew rate enhancement circuit 204 according to the embodiment of the present disclosure can control no current to flow in the second current source 212 by setting the third control voltage VN2 and the fourth control voltage VP2 to be equal to each other.

That is, in the embodiment of the present disclosure, the second slew rate enhancement circuit 204 can control a current to flow in the second current source 212, if necessary. Accordingly, the power consumption of the buffer can be reduced, and the slew rate section can be minimized. In other words, although the amount of current flowing in the second current source 212 is increased, unnecessary current does not flow in the second current source 212. Hence, the power consumption of the buffer can be reduced, and the slew rate section can be minimized.

Figure 6:
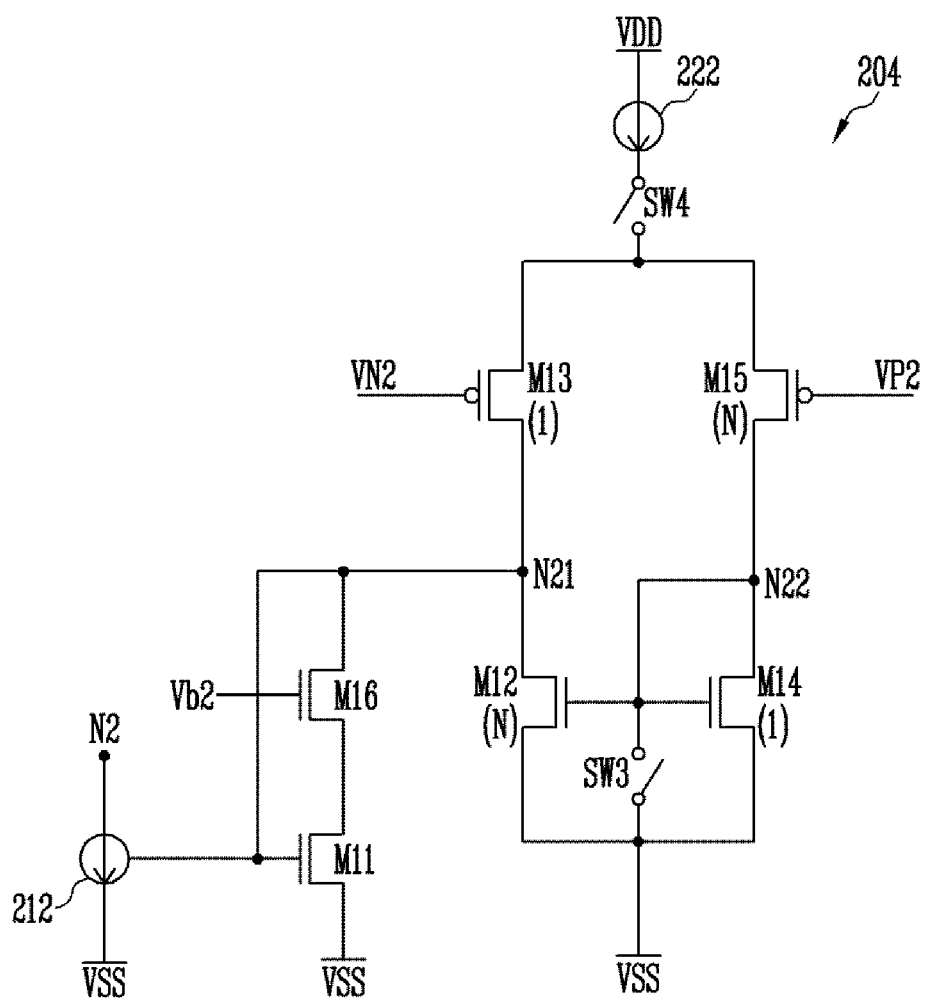
FIG. 6 is a diagram illustrating another embodiment of the second slew rate enhancement circuit shown in FIG. 2.

FIG. 6 is a diagram illustrating another embodiment of the second slew rate enhancement circuit shown in FIG. 2. In FIG. 6, components identical to those of FIG. 5 are designated by like reference numerals, and their detailed descriptions will be omitted.

Referring to FIG. 5, the second slew rate enhancement circuit 204 according to the another embodiment of the present disclosure additionally includes a third switch SW3 and a fourth switch SW4.

The third switch SW3 is coupled between the second power source VSS and the twenty-second node N22. The third switch SW3 maintains the turn-off state when the second slew rate enhancement circuit 204 is normally driven.

The fourth switch SW4 is coupled between the fourth current source 222 and the common node of the thirteenth transistor M13 and the fifteenth transistor M15. The fourth switch SW4 maintains the turn-on state when the second slew rate enhancement circuit 204 is normally driven.

The third switch SW2 and the fourth switch SW4 are used to minimize the power consumption of the buffer. As an example, when the third switch SW3 is turned on, the voltage of the second power source VSS is supplied to the gate electrodes of the twelfth transistor M12 and the fourteenth transistor M14, and accordingly, the twelfth transistor M12 and the fourteenth transistor M14 are turned off.

In addition, when the fourth switch SW4 is turned off, the fourth current source 222 is electrically interrupted from the thirteenth transistor M13 and the fifteenth transistor M15. Then, no current flows from the fourth current source 222 to the thirteenth transistor M13 and the fifteenth transistor M15. As described above, the turn-on/turn-off of the third switch SW3 and the fourth switch SW4 can be controlled such that the power consumption of the buffer is reduced, corresponding to a user's design intension.

The third switch SW2 and/or the fourth switch SW4 may be implemented with a P-type transistor and/or an N-type transistor.

Meanwhile, in the embodiment of the present disclosure, the first slew rate enhancement circuit 202 and the second slew rate enhancement circuit 204 may be set to an off state in a section except the slew rate section (i.e., when the voltage of the output terminal 208 is stabilized to a certain state). Thus, unnecessary power can be prevented from being consumed in the slew rate enhancement circuits 202 and 204, and the occurrence of an offset can be interrupted.

According to the present disclosure, the slew rate enhancement circuits can control a current to flow in a current source only when charging/discharging of a buffer node is necessary. Accordingly, the power consumption of the buffer can be minimized, and the buffer can operate at a high speed. Further, according to the present disclosure, the slew rate enhancement circuits are set to an off state when the voltage of the output terminal is stabilized. Accordingly, unnecessary power can be prevented from being consumed in the slew rate enhancement circuits, and the occurrence of an offset can be interrupted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A buffer having a first slew rate enhancement circuit connected to an output terminal and a first current source, and a second slew rate enhancement circuit connected to the output terminal and a second current source, the first slew rate enhancement circuit comprising:
a first transistor located between a first power source and an eleventh node, the first transistor having a gate electrode coupled to the eleventh node, the first transistor being coupled as a current mirror to the first current source;
a third current source having another side coupled to a second power source lower than the first power source;
a second transistor coupled between the first power source and the eleventh node;
a third transistor coupled between the eleventh node and one side of the third current source, the third transistor having a gate electrode supplied with a first control voltage;
a fourth transistor coupled between the first power source and a twelfth node, the fourth transistor having a gate electrode coupled to a gate electrode of the second transistor and the twelfth node; and
a fifth transistor coupled between the twelfth node and the one side of the third current source, the fifth transistor having a gate electrode supplied with a second control voltage,
wherein the second slew rate enhancement circuit has a different input signal from the first slew rate enhancement circuit, and
wherein, when the output terminal maintains a constant voltage, the first slew rate enhancement circuit controls no current to flow in the first current source, and the second slew rate enhancement circuit controls no current to flow in the second current source.

2. The buffer of claim 1, wherein the first slew rate enhancement circuit further comprises a sixth transistor coupled between the first transistor and the eleventh node, the sixth transistor being set to a turn-on state by a first bias voltage.

3. The buffer of claim 1, wherein the first transistor, the second transistor, the fourth transistor, and a sixth transistor are set as P-type transistors, and the third transistor and the fifth transistor are set as N-type transistors.

4. The buffer of claim 1, wherein, when the W/L of the fourth transistor is set to "1", the W/L of the second transistor is set to "N", where N is a rational number exceeding 1.

5. The buffer of claim 1, wherein, when the W/L of the third transistor is set to "1", the W/L of the fifth transistor is set to "N", where N is a rational number exceeding 1.

6. The buffer of claim 1, wherein no current flows in the first current source when the first control voltage and the second control voltage are equal to each other, and
a current flows in the first current source when the first control voltage is set higher than the second control voltage.

7. The buffer of claim 1, wherein the first slew rate enhancement circuit further comprises:
a first switch coupled between the first power source and the twelfth node; and
a second switch located between the one side of the third current source and a common node of the third transistor ad the fifth transistor.

8. A buffer having a first slew rate enhancement circuit connected to an output terminal and a first current source, and a second slew rate enhancement circuit connected to the output terminal and a second current source, the second slew rate enhancement circuit comprising:
an eleventh transistor located between a twenty-first node and a second power source, the eleventh transistor having a gate electrode coupled to the twenty-first node, the eleventh transistor being coupled as a current mirror to the second current source;
a fourth current source having another side coupled to a first power source higher than the second power source;
a twelfth transistor coupled between the twenty-first node and the second power source;
a thirteenth transistor coupled between one side of the fourth current source and the twenty-first node, the thirteenth transistor having a gate electrode supplied with a third control voltage;
a fourteenth transistor coupled between a twenty-second node and the second power source, the fourteenth transistor having a gate electrode coupled to a gate electrode of the twelfth transistor and the twenty-second node; and
a fifteenth transistor coupled between the one side of the fourth current source and the twenty-second node, the fifteenth transistor having a gate electrode supplied with a fourth control voltage,
wherein the first slew rate enhancement circuit has a different input signal from the second slew rate enhancement circuit, and
wherein, when the output terminal maintains a constant voltage, the first slew rate enhancement circuit controls no current to flow in the first current source, and the second slew rate enhancement circuit controls no current to flow in the second current source.

9. The buffer of claim 8, wherein the second slew rate enhancement circuit further comprises a sixteenth transistor coupled between the eleventh transistor and the twenty-first node, the sixteenth transistor being set to a turn-on state by a second bias voltage.

10. The buffer of claim 8, wherein the eleventh transistor, the twelfth transistor, fourteenth transistor, and a sixteenth transistor are set as N-type transistors, and the thirteenth transistor and the fifteenth transistor are set as P-type transistors.

11. The buffer of claim 8, wherein, when the W/L of the fourteenth transistor is set to "1", the W/L of the twelfth transistor is set to "N", where N is a rational number exceeding 1.

12. The buffer of claim 8, wherein, when the W/L of the thirteenth transistor is set to "1", the W/L of the fifteenth transistor is set to "N", where N is a rational number exceeding 1.

13. The buffer of claim 8, wherein no current flows in the second current source when the third control voltage and the fourth control voltage are equal to each other, and
a current flows in the second current source when the third control voltage is set lower than the fourth control voltage.

14. The buffer of claim 8, wherein the second slew rate enhancement circuit further comprises:
a third switch coupled between the second power source and the twenty-second node; and a fourth switch located between the one side of the fourth current source and a common node of the thirteenth transistor and the fifteenth transistor.

15. A buffer comprising:
a first capacitor coupled between a first node and an output terminal;
a second capacitor coupled between a second node and the output terminal;
a first current source coupled between a first power source and the first node, the first current source supplying a current to the first node;
a second current source coupled between the second node and a second power source set as a voltage lower than that of the first power source, the second current source sinking a current from the second node;
a driver configured to supply a data signal to the output terminal;
a first slew rate enhancement circuit configured to control current flow of the first power source; and
a second slew rate enhancement circuit configured to control current flow of the second current source,
wherein, when the output terminal maintains a constant voltage, the first slew rate enhancement circuit controls no current to flow in the first current source, and the second slew rate enhancement circuit controls no current to flow in the second current source, and
wherein the first slew rate enhancement circuit has a different input signal from the second slew rate enhancement circuit.

* * * * *